US011887681B2

(12) United States Patent
Rayaprolu et al.

(10) Patent No.: US 11,887,681 B2
(45) Date of Patent: Jan. 30, 2024

(54) PERFORMING SELECTIVE COPYBACK IN MEMORY DEVICES

(71) Applicant: Micron Technology, Inc., Boise, ID (US)

(72) Inventors: Vamsi Rayaprolu, San Jose, CA (US); Ashutosh Malshe, Fremont, CA (US); Gary Besinga, Boise, ID (US); Roy Leonard, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 17/675,477

(22) Filed: Feb. 18, 2022

(65) Prior Publication Data

US 2023/0268018 A1 Aug. 24, 2023

(51) Int. Cl.

| | |
|---|---|
| ***G11C 11/34*** | (2006.01) |
| ***G11C 16/34*** | (2006.01) |
| ***G11C 16/10*** | (2006.01) |
| ***G11C 16/32*** | (2006.01) |
| ***G11C 16/26*** | (2006.01) |
| ***G11C 16/16*** | (2006.01) |

(52) U.S. Cl.

CPC ........ *G11C 16/3495* (2013.01); *G11C 16/102* (2013.01); *G11C 16/16* (2013.01); *G11C 16/26* (2013.01); *G11C 16/32* (2013.01)

(58) Field of Classification Search

CPC . G11C 16/10; G11C 11/5628; G11C 11/5642; G11C 16/0483; G11C 16/12

USPC ........................................................ 365/185.24

See application file for complete search history.

(56) References Cited

U.S. PATENT DOCUMENTS

2018/0039538 A1* 2/2018 Freikorn ............. G06F 11/1048
2019/0332294 A1* 10/2019 Kilari .................... G06F 3/0671

* cited by examiner

*Primary Examiner* — Son T Dinh

(74) *Attorney, Agent, or Firm* — Lowenstein Sandler LLP

(57) ABSTRACT

Systems and methods are disclosed including a memory device and a processing device operatively coupled to the memory device. The processing device can perform operations comprising determining a data validity metric value with respect to a source set of memory cells of the memory device; determining whether the data validity metric value satisfies a first threshold criterion; responsive to determining that the data validity metric value satisfies the first threshold criterion, performing a data integrity check on the source set of memory cells to obtain a data integrity metric value; determining whether the data integrity metric value satisfies a second threshold criterion; and responsive to determining that the data integrity metric value fails to satisfy the second threshold criterion, causing the memory device to copy data from the source set of memory cells to a destination set of memory cells of the memory device.

20 Claims, 6 Drawing Sheets

100
MEMORY SUB-SYSTEM 110
MEMORY SUB-SYSTEM CONTROLLER 115
PROCESSOR 117
LOCAL MEMORY 119
MEMORY MANAGEMENT COMPONENT 113
ECC Encoder/ Decoder 111
HOST SYSTEM 120
MEMORY DEVICE 130
Local Media Controller 135
Program Manager 136
Page Buffers 152
MEMORY DEVICE 140

PERFORMING SELECTIVE COPYBACK IN MEMORY DEVICES

TECHNICAL FIELD

Embodiments of the disclosure relate generally to memory sub-systems, and more specifically, relate to performing selective copyback in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
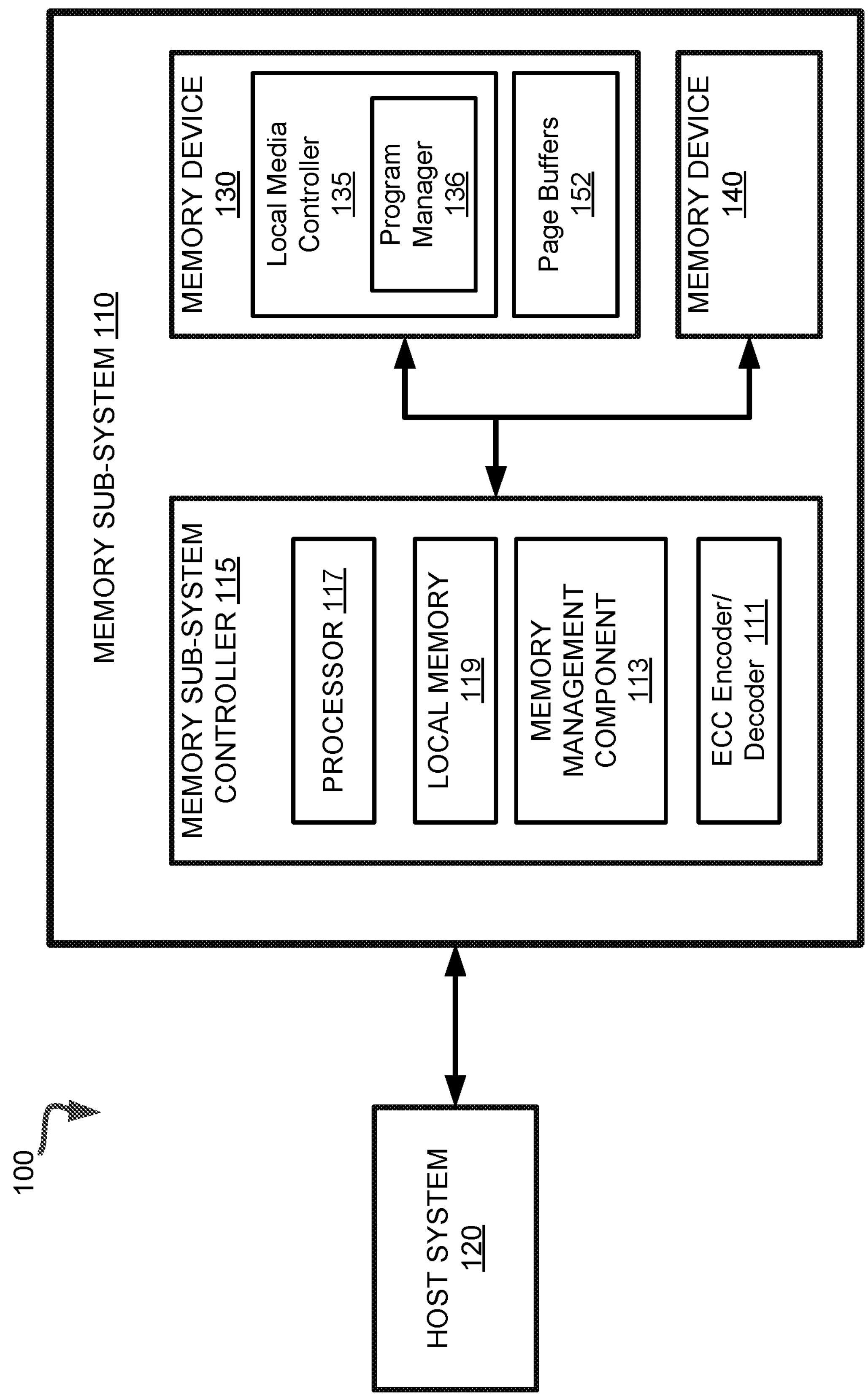
FIG. 1A illustrates an example computing system that includes a memory sub-system in accordance with some embodiments of the present disclosure.

Aspects of the present disclosure are directed to performing a selective copyback in memory devices. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltage ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store two bits of information per cell, triple-level cell (TLC) memory that can store three bits of information per cell, and/or quad-level cell (QLC) memory that can store four bits of information per cell. MLC memory, TLC, memory, and QLC memory can be collectively referred to as higher-level cell (HLC). The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In certain memory devices, the memory sub-system controller controls a copyback and/or internal data move (IDM) processes (referred to jointly herein as "copyback") in which data are copied from the SLC memory to the HLC memory. This copyback process is also referred to as folding or compacting data from the SLC memory into the HLC memory, as multiple bits of SLC data can be stored within a single cell of the HLC memory. The memory sub-system controller can control copyback operations within the memory device, for example, to convert SLC data to high-density data and thereby free up additional memory array space for more data. In some cases, the SLC memory is used as SLC cache where the data stored in SLC cache are copied into HLC data as the memory device is freed up from other program, read, and erase operations to do so.

In these memory devices, because errors in SLC data can be amplified and thus become uncorrectable once copied back into HLC memory, the memory sub-system controller needs to ensure the SLC data is sufficiently error free, e.g., that the copyback read bit error rate (RBER) is less than a particular reliability error threshold. To do so, the controller performs a scan of the SLC data by reading the SLC data out, decoding the SLC data according to an error correction code (ECC) algorithm, and doing an error check on the SLC data. Because sometimes errors can come from defects in individual pillars, channels, and/or wordlines, each wordline is scanned, e.g., in lieu of selectively checking data associated with only certain wordlines. This means that a large amount of SLC data is read out and error checked before the controller can proceed with directing the memory device to perform the copyback.

If certain errors are detected and are correctable, the controller can correct the errors and re-encode the SLC data before being programmed into the HLC memory. However, if the errors that are detected are difficult to correct, the controller performs a refresh of the SLC data before the data is re-encoded and programmed into the HLC memory. Because HLC memory is becoming more common and SLC memory is often used as cache to maintain high performance, the copyback process is performed often, causing these memory devices to incur significant performance penalties in latency, e.g., in the scanning and reading of the SLC data to clear the SLC data to be copied back into HLC memory, and in data bus congestion.

Aspects of the present disclosure address the above and other deficiencies by the memory sub-system controller performing a selective copyback. In an illustrative example, the memory sub-system controller can perform operations to optimize the overall performance of the memory device and select a block (source block) on which to perform a media management operation. The media management operation can include a garbage collection operation, a wear leveling operation, etc. The memory sub-system controller can then perform a data validity check on the source block. Data validity can be indicative of a rate of access to the block and/or the age of the data stored on the block. In some embodiments, data validity can be measured using a validity metric based on program/erase cycles (PECs), time after program (TAP), a block read count, etc. For example, the memory sub-system controller can perform a data validity check by obtaining a value indicative of the amount of PECs that occurred with respect to the block, the TAP of the block, the read count of the block, etc. In some embodiments, the data validity check can determine a composite value that is a mathematical function (e.g., a weighted sum) of values of two or more validity metrics.

The memory sub-system controller can then determine whether the data validity value satisfies a threshold criterion. If the data validity metric fails to satisfy (e.g., is lower than) the threshold criterion (e.g., a read count threshold value, a PEC threshold value, and/or TAP threshold value), indicating a relatively low rate of access and/or relatively young data stored on the source block, the memory sub-system controller can send a command, to the memory device, to perform a blind copyback operation. A blind copyback operation includes instructing the memory device to perform a copyback of the data from memory cells of the source block to memory cells of a destination block without further intervention by the memory sub-system controller.

If the data validity metric satisfies (e.g., meets or exceeds) a threshold criterion (e.g., a read count threshold value, a PEC threshold value, and/or TAP threshold value), indicating a relatively high rate of access and/or relatively old data stored on the source block, the memory sub-system controller can perform a data integrity check on the source block. The data integrity check can include the memory sub-system controller reading data from a set of sampled memory cells in the source block. The data integrity check can verify that the data stored at memory cells does not include any errors, or that the number of errors are suitably low. In one example, the memory sub-system controller identifies a data integrity metric, such as the bit error count (BEC) or the raw bit error rate (RBER), representing a number of bit errors per unit of time that the data stored at the data block experiences. The memory sub-system controller can then determine whether a value of the data integrity metric (e.g., a BEC value, a RBER value, etc.) satisfies a threshold criterion (e.g., meets or exceeds a threshold value). If the data integrity metric fails to satisfy the threshold criterion (e.g., BEC or RBER value is below a threshold value), the memory sub-system controller sends, to the memory device, a blind copyback command with respect to the source block.

If the data integrity metric satisfies a threshold criterion (e.g., BEC or RBER value is above a threshold value), indicating a high error rate associated with data stored at the block, the memory sub-system controller sends, to the memory device, a corrective copyback command. A corrective copyback operation includes sending, to the memory device, instructions to wait for the memory sub-system controller to perform error correction operations or a refresh of the data stored in the memory cells of the source block before initiating a copyback of the source block. In some embodiments, the memory sub-system controller performs a scan of the data by reading the data out from the memory device, decoding the source data according to an error correction code (ECC) algorithm, and performing an error check on the source data. The memory sub-system controller can then use one or more error handling mechanisms to correct any detected errors. Once the data is corrected, the processing logic can send the corrected data to the memory device to be programmed to the destination block.

Advantages of the systems and methods implemented in accordance with some embodiments of the present disclosure include, but are not limited to, a reduction in complexity and improvement in performance of clearing source data stored in memory cells (e.g., SLC memory cells) to be copied back into destination memory cells (e.g., HLC memory cells). This increase in performance includes reduced latency, particularly when the processing device needs take no further action before the copyback is performed, and less congestion on a data bus (e.g., open NAND flash interface (ONFI) bus) located between the memory sub-system controller and the memory device when avoiding reading out and error checking the SLC data. Other advantages will be apparent to those skilled in the art of folding data within memory devices, which will be discussed hereinafter. Although embodiments are described using wordlines of a NAND flash memory, aspects of the present disclosure can be applied to other types of memory sub-systems.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In some embodiments, the controller 115 (e.g., processing device) includes an error-correcting code (ECC) encoder/decoder 111. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data. The memory sub-system controller 115 can further include a processor 117 (processing device) configured to execute instructions stored in local memory 119 for performing the operations described herein. The local memory 119 can also buffer data being used by the executed instructions. Example ECC processes can include parity checks, Hamming codes, checksums, cyclic redundancy checks (CRCs), cryptographic hashes, block codes, convolutional codes, turbo codes, low-density parity check (LDPC), etc.

In at least some embodiments, the controller 115 further includes a memory management component 113 that can handle interactions of the controller 115 with the memory devices of the memory sub-system 110, such as with the memory device 130. For example, the memory interface component 113 can determine whether to perform a blind copyback operation or a corrective copyback operation with respect to source data stored on a block. A blind copyback operation includes sending a blind copyback command to memory device 130, 140 with instructions to perform a copyback of data from source memory cells to destination memory cells without further intervention by the controller 115. A corrective copyback operation includes sending a corrective copyback command to memory device 130, 140 with instructions to wait for the controller 115 to perform error correction or a refresh of the data stored in the source memory cells before performing a copyback operation. In some embodiments, the memory sub-system controller 115 includes at least a portion of the memory management component 113. In some embodiments, the memory management component 113 is part of the host system 120, an application, or an operating system. In other embodiments, local media controller 135 includes at least a portion of memory management component 113 and is configured to perform the functionality described herein. The memory management component 113 can communicate directly with the memory devices 130 and 140 via a synchronous interface. Furthermore, transfers of data between the memory device 130 and the memory device 140 can be done within the memory sub-system 110 without accessing the host system 120.

In various embodiments, the memory device 130 further includes one or more page buffers 152, which can provide the circuitry used to program data to the memory cells of the memory device 130 and to read the data out of the memory cells. The local media controller 135 can further include a program manager 136, which is implemented using firmware, hardware, or a combination of firmware and hardware. In one embodiment, the program manager 136 receives a blind copyback command and/or a corrective copyback command from the memory management component 113. The program manager 136 can execute the blind copyback command by performing a copyback of data from source memory cells to destination memory cells without further intervention by the controller 115, or execute the corrective copyback command by waiting for the controller 115 to perform error correction or a refresh of the data stored in the source memory cells before performing a copyback operation. In some embodiments, the program manager 136 is part of the host system 120, an application, or an operating system. Further details with regards to the operations of program manager 136 are described below.

Figure 1B:
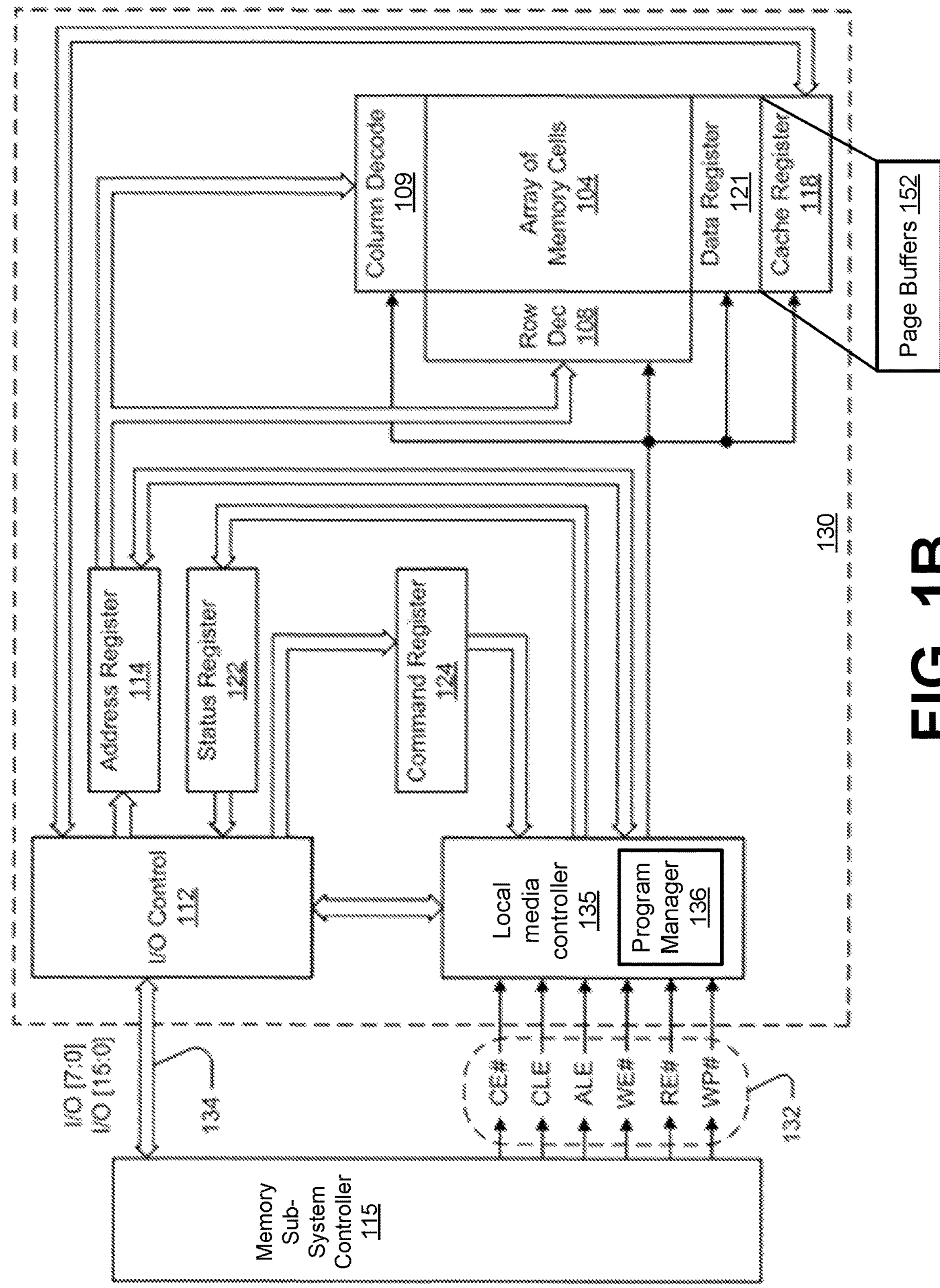
FIG. 1B is a block diagram of a memory device in communication with a memory sub-system controller of a memory sub-system in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 109 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 109 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. The local media controller 135 can also include the program manager 136, as was discussed.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) a page buffer of the one or more page buffers 152 of the memory device 130. Each page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
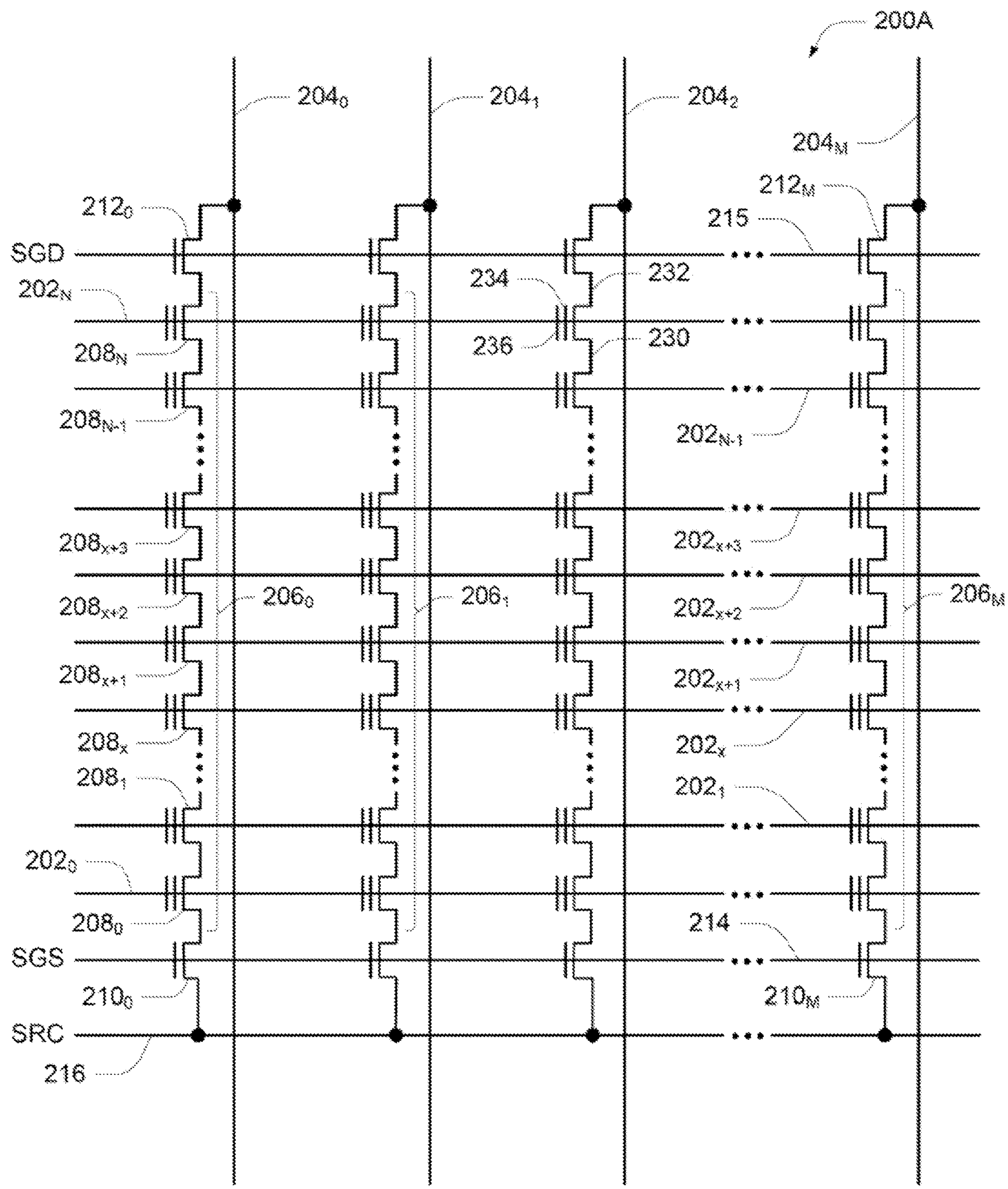
FIG. 2A-2B are schematics of portions of an array of memory cells as could be used in a memory of the type described with reference to FIG. 1B in accordance with some embodiments of the present disclosure.
Figure 2B:
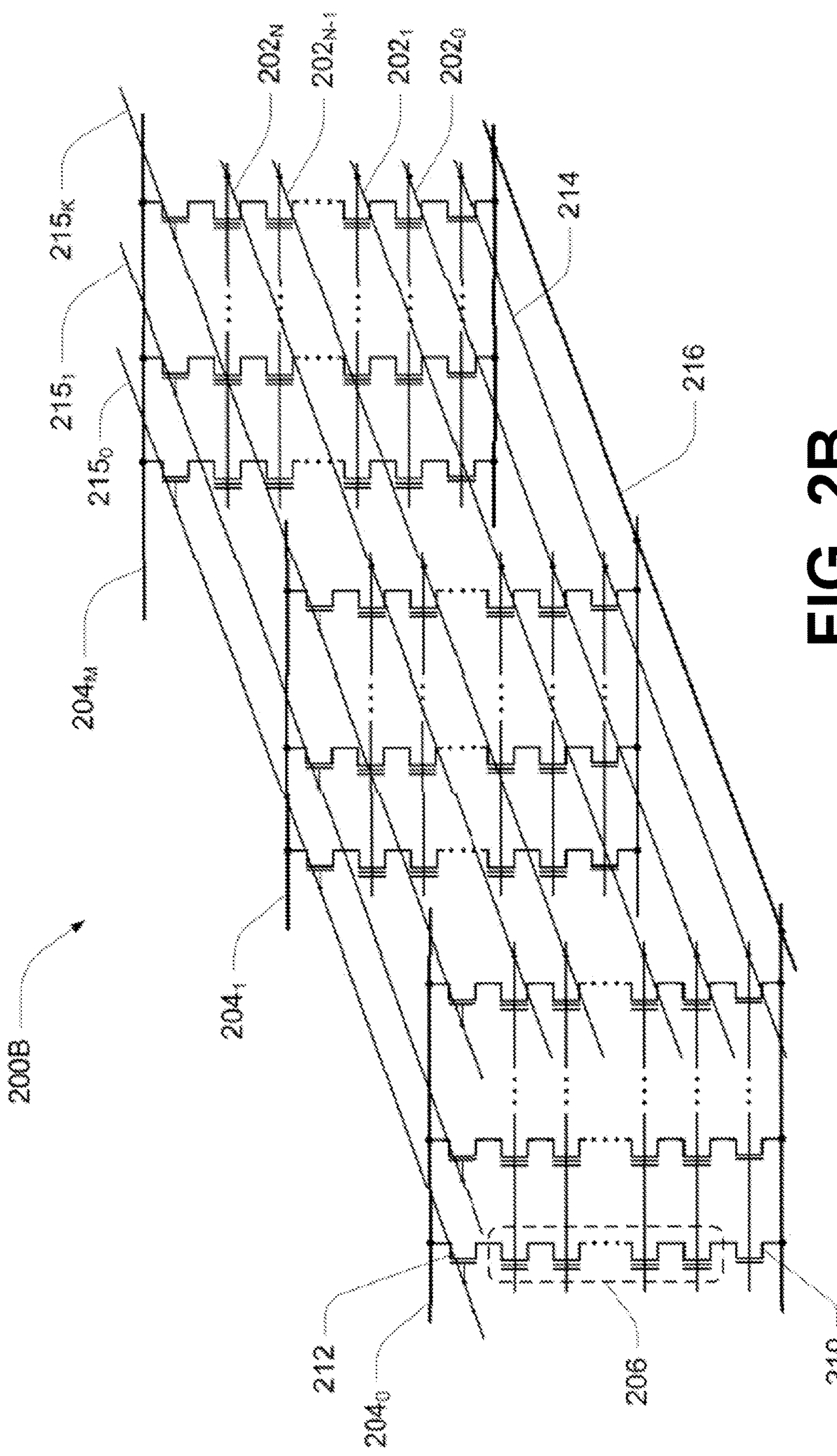

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $\mathbf{202}_0$ to $\mathbf{202}_N$, and data lines, such as bitlines $\mathbf{204}_0$ to $\mathbf{204}_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $\mathbf{206}_0$ to $\mathbf{206}_M$. Each NAND string 206 can be connected (e.g., selectively connected) to a common source (SRC) 216 and can include memory cells $\mathbf{208}_0$ to $\mathbf{208}_N$. Each bitline 204 and NAND string 206 can be associated with a sub-block of a set of sub-blocks of the memory array 200A. The memory cells 208 can represent non-volatile memory cells for storage of data. The memory cells 208 of each NAND string 206 can be connected in series between a select gate 210 (e.g., a field-effect transistor), such as one of the select gates $\mathbf{210}_0$ to $\mathbf{210}_M$ (e.g., that can be source select transistors, commonly referred to as select gate source), and a select gate 212 (e.g., a field-effect transistor), such as one of the select gates $\mathbf{212}_0$ to $\mathbf{212}_M$ (e.g., that can be drain select transistors, commonly referred to as select gate drain). Select gates $\mathbf{210}_0$ to $\mathbf{210}_M$ can be commonly connected to a select line 214, such as a source select line (SGS), and select gates $\mathbf{212}_0$ to $\mathbf{212}_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $\mathbf{208}_0$ of the corresponding NAND string 206. For example, the drain of select gate $\mathbf{210}_0$ can be connected to memory cell $\mathbf{208}_0$ of the corresponding NAND string $\mathbf{206}_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $\mathbf{212}_0$ can be connected to the bitline $\mathbf{204}_0$ for the corresponding NAND string $\mathbf{206}_0$. The source of each select gate 212 can be connected to a memory cell $\mathbf{208}_N$ of the corresponding NAND string 206. For example, the source of select gate $\mathbf{212}_0$ can be connected to memory cell $\mathbf{208}_N$ of the corresponding NAND string $\mathbf{206}_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $\mathbf{202}_N$ and selectively connected to even bitlines 204 (e.g., bitlines $\mathbf{204}_0$, $\mathbf{204}_2$, $\mathbf{204}_4$, etc.) can be one physical page of the memory cells 208 (e.g., even memory cells) while memory cells 208 commonly connected to wordline $\mathbf{202}_N$ and selectively connected to odd bitlines 204 (e.g., bitlines $\mathbf{204}_1$, $\mathbf{204}_3$, $\mathbf{204}_5$, etc.) can be another physical page of the memory cells 208 (e.g., odd memory cells).

Although bitlines $\mathbf{204}_3$ $\mathbf{204}_5$ are not explicitly depicted in FIG. 2A, it is apparent from the figure that the bitlines 204 of the array of memory cells 200A can be numbered consecutively from bitline $\mathbf{204}_0$ to bitline $\mathbf{204}_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $\mathbf{202}_0$-$\mathbf{202}_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $\mathbf{204}_0$-$\mathbf{204}_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $\mathbf{215}_0$-$\mathbf{215}_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

Figure 3:
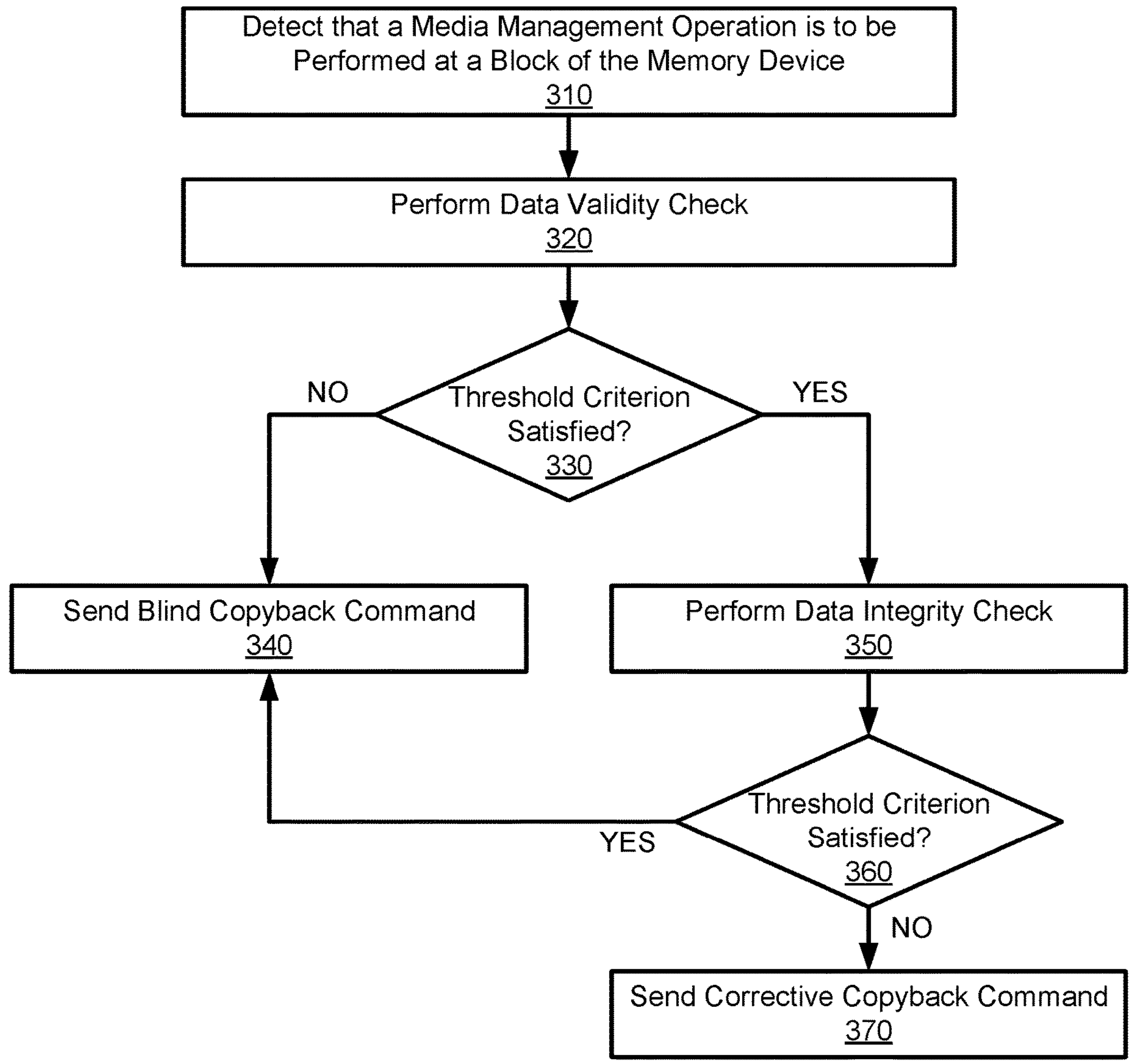
FIG. 3 is a flow diagram of an example method for selecting a copyback operation in accordance with some embodiments of the present disclosure.

FIG. 3 is a flow diagram of an example method 300 for selecting a copyback operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media management component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The operations of method 300 can relate to performing a blind copyback or a selective copyback of SLC data to HLC, HLC data to SLC data, SLC data to SLC data, and/or HLC data to HLC data. The copyback operation can be performed from a source block to a destination block.

At operation 310, processing logic detects that a media management operation is to be performed at a source block of the memory device. In some embodiments, the media management operation can include a garbage collection operation, a wear leveling operation, etc. The media management operation can be triggered as part of as operations to optimize the overall performance of the memory device. For example, the processing logic can enable the optimization operations when the memory sub-system is idle. The source block on which the media management operation is to be performed can be selected randomly, sequentially, from a list (e.g., a list of blocks containing programmed data, a list of blocks of a particular memory type, such as SLC memory, etc.), in response to a threshold criterion being satisfied (e.g., a parameter associated with the block satisfying a threshold value), etc. In other embodiments, the media management operation (and the remaining operations discussed with respect to method 300) can be performed on other memory granularities, such as a page, a wordline, a management unit (MU), etc. A MU can be a group of pages across dice and/or channels, and can represent an individual segment of the memory device that can be written or erased in a single operation.

At operation 320, the processing logic performs a data validity check on the source block. Data validity can be indicative of a rate of access to the block, the age of the data stored on the block, etc. Data validity can be measured using one or more validity metrics based on program/erase cycles (PECs), time after program (TAP), a block read count, etc. In one example, the data validity check can include obtaining a value associated with a single validity metric (e.g., the amount of PECs that occurred with respect to the block, the TAP of the block, the read count of the block, etc.). In another example, the data validity check can include obtaining a composite value that is a mathematical function (e.g., a weighted sum) of the values of two or more validity metrics.

A read count refers to using a read counter that tracks the number of read operations performed on each block, or on any portion of the block (e.g., on a page, on a wordline, etc.). Each time a read operation is performed on a certain block, the memory sub-system controller 115 can increment a corresponding unit level read counter (e.g., block read counter, page read counter, wordline read counter, etc.). In some embodiments, the read counters can be maintained in local memory 119.

A PEC refers to a sequence of operations in which data is programmed to a memory cell, then erased from the memory cell, then rewritten to the memory cell. PECs can serve as a metric for quantifying the endurance of a memory cell. To track PEC cycles, the memory sub-system can maintain a PEC counter for each block, or any portion of each block. In some embodiments, the PEC counter can be a write counter that tracks the number of write operations performed on each block (or any portion of each block), an erase counter that tracks the number of erase operations performed on each block, etc. Each time a write operation or erase operation is performed with respect to a certain block, the memory sub-system controller 115 can increment a corresponding PEC counter. In some embodiments, the PEC counters can be maintained in local memory 119.

Time After Program (TAP) refers to the time since a memory cell has been written. TAP can be estimated (e.g., inference from a data integrity metric), or directly measured (e.g., from a controller clock). In some embodiments, the memory sub-system controller 115 can maintain a metadata table (in local memory 119) to track the TAP of each block, of each page of a block, of each wordline of a block, etc. In some embodiments, the oldest TAP of a block (e.g., the oldest page programmed in the block) can be used as the TAP value for the entire block. In other embodiments, an average of the TAP for each page can be used as the TAP value for the entire block. In yet other embodiments, other criterion related to the TAP values of any portion or combination of portions of the block can be used as the TAP value for the entire block.

At operation 330, the processing logic determines whether the data validity value satisfies a threshold criterion. The threshold criterion can include one or more values, one or more conditions, etc. The threshold criterion can be determined and set during manufacturing of the memory sub-system 110 or during programming and/or calibration of the memory sub-system 110. If the data validity metric satisfies (e.g., meets or exceeds, is lower than, etc.) a threshold criterion (e.g., the read count, PEC value, and/or TAP value is above a threshold value), indicating a high rate of access and/or relatively old data stored on the source block, the processing logic proceeds to operation 350. If the data validity metric fails to satisfy (e.g., meets or exceeds, be lower than, etc.) the threshold criterion (e.g., a read count threshold value, a PEC threshold value, and/or TAP threshold value), indicating a relatively low rate of access and/or relatively young data stored on the source block, the processing logic proceeds to operation 340.

At operation 340, the processing logic sends, to the memory device, a blind copyback command with respect to the source block. More specifically, the processing logic generates a blind copyback command that identifies a set of the source memory cells that store data to be copied to a set of the destination memory cells. The processing logic then transmits the blind copyback command to the control logic (e.g., of the local media controller 135) to be performed by the control logic. Responsive to receiving the blind copyback command, the control logic can initiate a copyback operation with respect to the source block by enabling the memory device to perform a copyback of the stored data to the set of the destination memory cells.

At operation 350, the processing logic performs a data integrity check on the source block. The processing logic can perform the data integrity check on one, some, or all of the pages of the source block. In some embodiments, the data integrity check can include reading data from the set of sampled memory cells in the source block. In some embodiments, the set of sampled memory cells in the source block can be one or more memory cells of the block, a page, a group of pages in the block, a wordline, a group of wordlines in the block, or any combination thereof. In some embodiments, the set of sampled memory cells can be selected randomly, can be a predetermined group (e.g., the first, twentieth, and fortieth wordlines of a block), can be a rotating group, etc.

The data integrity check can verify that the data stored at memory cells does not include any errors, or that the number of errors are below a predetermined threshold. During a scan operation, the processing logic identifies one or more data integrity metrics, such as the bit error count (BEC) or the raw bit error rate (RBER), representing a number of bit errors per unit of time that the data stored at the data block experiences. In some embodiments, during the data integrity check, the processing logic reads a raw code word (i.e., a series of a fixed number of bits) from the page. The processing logic can apply the code word to an error correcting code (ECC) decoder to generate a decoded code word and compare the decoded code word to the raw code word. The processing logic can count a number of flipped bits between the decoded code word and the raw code word, with a ratio of the number of flipped bits to the total number of bits in the code word representing the RBER.

At operation 360, the processing logic determines whether a value of the data integrity metric (e.g., a BEC value, a RBER value, etc.) satisfies a threshold criterion (e.g., meets or exceeds a threshold value, is lower than a threshold value, etc.). The threshold criterion can be determined and set during manufacturing of the memory sub-system 110 or during programming and/or calibration of the memory sub-system 110. In an example, the processing logic can determine whether an RBER value or a BEC value exceeds a threshold value. If the data integrity metric satisfies a threshold criterion (e.g., BEC or RBER value is above a threshold value), indicating a high error rate associated with data stored at the block, the processing logic proceeds to operation 370. If the data integrity metric fails to satisfy the threshold criterion (e.g., BEC or RBER value is below a threshold value), the processing logic proceeds to operation 340, where the processing logic sends, to the memory device, a blind copyback command with respect to the source block.

At operation 370, the processing logic sends, to the memory device, a corrective copyback command. The corrective copyback command can be used to detect and correct errors in the source data, and then write the corrected data to the destination block. In some embodiments, the corrective copyback command requests the memory device to send the data, from the source block, to the ECC encoder/decoder 111 to correct errors in the data. In particular, the processing logic can performs a scan of the data by reading the data out from the memory device, decoding the source data according to an error correction code (ECC) algorithm, and performing an error check on the source data. In response to detecting that the data contains an error(s), the processing logic can use one or more error handling mechanisms to correct the detected error(s). Error handling mechanisms can be hardware or software based procedures or operations used by the memory sub-system controller to correct an error. Once the data is corrected, the processing logic can send the corrected data to the memory device to be programmed to the destination block. In some embodiments, the processing logic can select an empty block as the destination block. In other embodiments, the processing logic can identify one or more next available wordlines in a block in which to write the source or corrected data to. In some embodiments, the destination block can include HLC memory cells.

Figure 4:
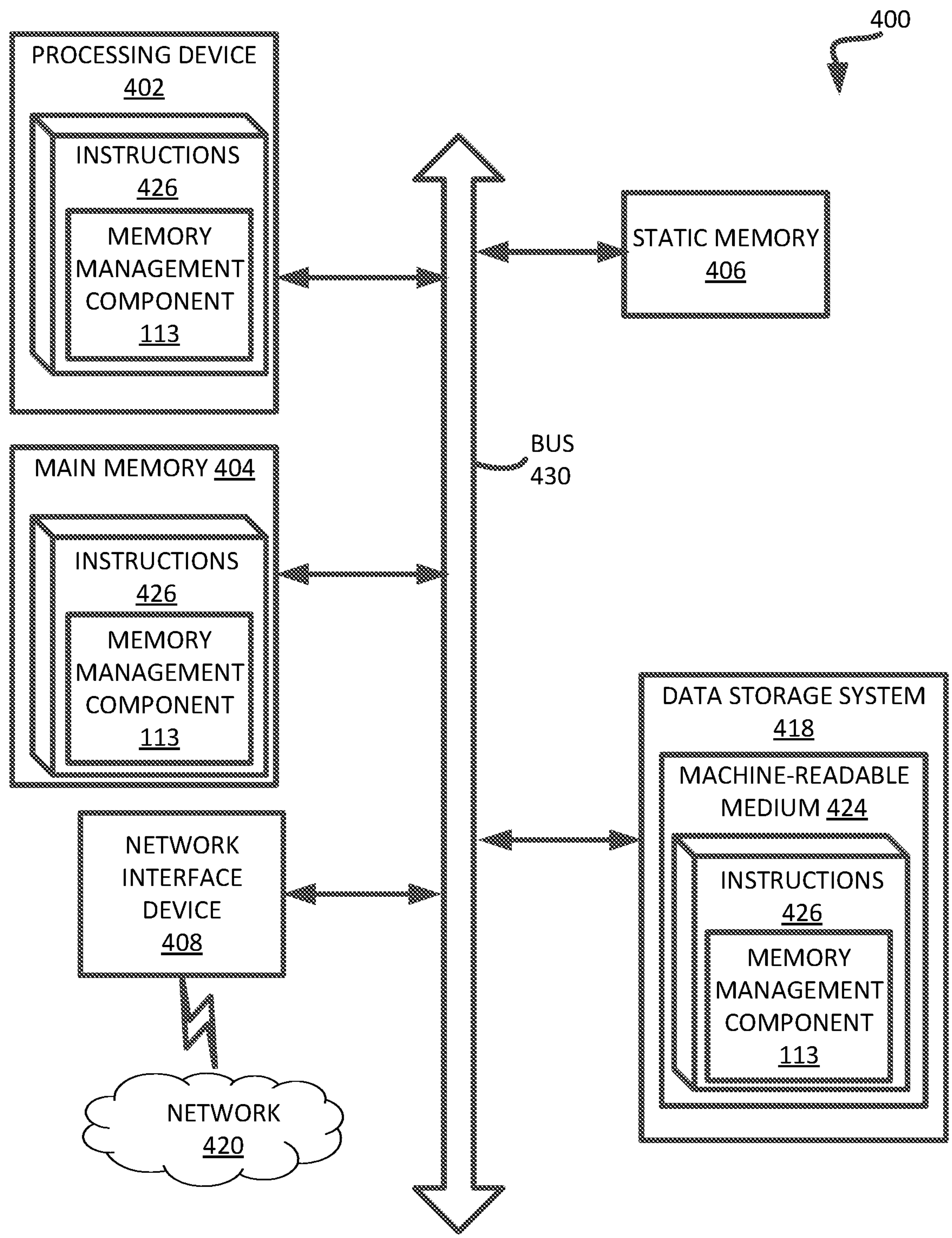
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1A) that includes or utilizes a memory sub-system (e.g., the memory sub-system 110 of FIG. 1A) or can be used to perform the operations of a controller (e.g., to execute an operating system to perform operations corresponding to media management component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430. Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1A.

In one embodiment, the instructions 426 include instructions to implement functionality corresponding to media management component 113 of FIG. 1A. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
- a memory device; and
- a processing device, operatively coupled to the memory device, to perform operations comprising:
  - determining a data validity metric value with respect to a source set of memory cells of the memory device;
  - determining whether the data validity metric value satisfies a first threshold criterion;
  - responsive to determining that the data validity metric value satisfies the first threshold criterion, performing a data integrity check on the source set of memory cells to obtain a data integrity metric value;
  - determining whether the data integrity metric value satisfies a second threshold criterion; and
  - responsive to determining that the data integrity metric value fails to satisfy the second threshold criterion, causing the memory device to copy data from the source set of memory cells to a destination set of memory cells of the memory device.

2. The system of claim 1, wherein the data validity metric value reflects at least one of a program/erase cycles (PECs) value, a time after program (TAP) value, or a block read count value.

3. The system of claim 1, wherein determining the data validity metric value is performed in response to a media management operation.

4. The system of claim 1, wherein the processing device performs further operations comprising:

responsive to determining that the data validity value fails to satisfy the first threshold criterion, copying the data from the source set of memory cells to the destination set of memory cells.

5. The system of claim 1, wherein the data integrity metric value reflects at least one of a bit error count (BEC) value or a raw bit error rate (RBER) value.

6. The system of claim 1, wherein the processing device performs further operations comprising:

responsive to determining that the data integrity metric value satisfies the second threshold criterion, performing an error handling operation on the data to generate corrected data.

7. The system of claim 6, wherein the processing device to perform further operations comprising:

copying the corrected data to the destination set of memory cells.

8. The system of claim 1, wherein the source set of memory cells comprises single-level cell (SLC) memory cells.

9. The system of claim 1, wherein the destination set of memory cells comprises higher-level cell (HLC) memory cells.

10. A method, comprising:

determining, by a processor, a data validity metric value with respect to a source set of memory cells of the memory device;

determining whether the data validity metric value satisfies a first threshold criterion;

responsive to determining that the data validity metric value satisfies the first threshold criterion, performing a data integrity check on the source set of memory cells to obtain a data integrity metric value;

determining whether the data integrity metric value satisfies a second threshold criterion;

responsive to determining that the data integrity metric value satisfies the second threshold criterion, performing an error handling operation on data from the source set of memory cells to generate corrected data; and copying the corrected data to a destination set of memory cells.

11. The method of claim 10, wherein the data validity metric value reflects at least one of a program/erase cycles (PECs) value, a time after program (TAP) value, or a block read count value.

12. The method of claim 10, wherein determining the data validity metric value is performed in response to a media management operation.

13. The method of claim 10, further comprising:

responsive to determining that the data validity value fails to satisfy the first threshold criterion, copying the data from the source set of memory cells to the destination set of memory cells.

14. The method of claim 10, wherein the data integrity metric value reflects at least one of a bit error count (BEC) value or a raw bit error rate (RBER) value.

15. The method of claim 10, further comprising:

responsive to determining that the data integrity metric value fails to satisfy the second threshold criterion, causing the memory device to copy the data from the source set of memory cells to the destination set of memory cells of the memory device.

16. The method of claim 10, wherein the source set of memory cells comprises single-level cell (SLC) memory cells.

17. The method of claim 10, wherein the destination set of memory cells comprises higher-level cell (HLC) memory cells.

18. A non-transitory computer-readable storage medium comprising instructions that, when executed by a processing device operatively coupled to a memory, performs operations comprising:

determining a data validity metric value with respect to a source set of memory cells of the memory device;

determining whether the data validity metric value satisfies a first threshold criterion;

responsive to determining that the data validity metric value satisfies the first threshold criterion, performing a data integrity check on the source set of memory cells to obtain a data integrity metric value;

determining whether the data integrity metric value satisfies a second threshold criterion; and responsive to determining that the data integrity metric value fails to satisfy the second threshold criterion, causing the memory device to copy data from the source set of memory cells to a destination set of memory cells of the memory device.

19. The non-transitory computer-readable storage medium of claim 18, wherein the processing device performs further operations comprising:

responsive to determining that the data validity value fails to satisfy the first threshold criterion, copying the data from the source set of memory cells to the destination set of memory cells.

20. The non-transitory computer-readable storage medium of claim 18, wherein the processing device performs further operations comprising:

responsive to determining that the data integrity metric value satisfies the second threshold criterion, performing an error handling operation on the data to generate corrected data.

* * * * *